(12) United States Patent
Meyer et al.

(10) Patent No.: US 10,663,509 B2
(45) Date of Patent: May 26, 2020

(54) ACCIDENTAL ARC DETECTION UNIT AND METHOD THEREOF

(71) Applicant: Siemens AG, Munich (DE)

(72) Inventors: Joerg Meyer, Dresden (DE); Peter Schegner, Dresden (DE); Karsten Wenzlaff, Dresden (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 360 days.

(21) Appl. No.: 15/609,112

(22) Filed: May 31, 2017

(65) Prior Publication Data

US 2017/0343598 A1 Nov. 30, 2017

(30) Foreign Application Priority Data

May 31, 2016 (DE) .................. 10 2016 209 443

(51) Int. Cl.
*G01R 31/02* (2006.01)
*H02H 1/00* (2006.01)
(Continued)

(52) U.S. Cl.
CPC ......... *G01R 31/025* (2013.01); *G01R 19/165* (2013.01); *H02H 1/0015* (2013.01);
(Continued)

(58) Field of Classification Search
CPC ..... H01L 31/02; H01L 31/02021; H02H 1/00; H02H 1/0015; H02H 3/00; G01R 19/00; G01R 31/02; G01R 31/025
(Continued)

(56) References Cited

U.S. PATENT DOCUMENTS

| 7,627,400 B2 | 12/2009 | Dutoya et al. |
| 2006/0109009 A1 | 5/2006 | Banke et al. |

(Continued)

FOREIGN PATENT DOCUMENTS

| CN | 101027565 A | 8/2007 |
| CN | 101238623 A | 8/2008 |

(Continued)

OTHER PUBLICATIONS

European Search Report dated Oct. 27, 2017.
(Continued)

*Primary Examiner* — Tuan T Dinh
(74) *Attorney, Agent, or Firm* — Harness, Dickey & Pierce, P.L.C.

(57) ABSTRACT

An arc fault detection unit for an electrical low-voltage circuit, includes at least one voltage sensor assigned to the circuit, for periodically determining electrical voltage values of the circuit, and at least one current sensor assigned to the circuit, for periodically determining electrical current magnitudes of the circuit, both of which are connected to an evaluation unit. The sensors being embodied such that value pairs, having a voltage value and a current magnitude are determined continuously, a value set including a plurality of value pairs. Further, an arc voltage, compared to a first threshold value, is calculated from three value sets and in response to the first threshold value being exceeded, an arc fault detection signal is output.

33 Claims, 4 Drawing Sheets

(51) Int. Cl.
*G01R 19/165* (2006.01)
*H02H 3/16* (2006.01)
*H02H 3/38* (2006.01)
*G01R 31/12* (2020.01)

(52) U.S. Cl.
CPC ............... *H02H 3/16* (2013.01); *H02H 3/38* (2013.01); *G01R 31/1272* (2013.01)

(58) Field of Classification Search
USPC .................................. 361/2, 12–18, 42, 63
See application file for complete search history.

(56) References Cited

U.S. PATENT DOCUMENTS

| | | |
|---|---|---|
| 2006/0274460 A1 | 12/2006 | Zuercher et al. |
| 2007/0086124 A1* | 4/2007 | Elms .................. H02H 1/0015 361/10 |
| 2008/0033602 A1 | 2/2008 | Dutoya et al. |
| 2009/0040665 A1* | 2/2009 | Elms .................. H02H 1/0015 361/42 |
| 2009/0108967 A1* | 4/2009 | Parker ................ H02H 1/0015 335/20 |
| 2010/0157486 A1* | 6/2010 | Parker ................ H02H 1/0015 361/2 |
| 2010/0312505 A1 | 12/2010 | Berger et al. |
| 2011/0019444 A1 | 1/2011 | Dargatz |
| 2011/0141644 A1* | 6/2011 | Hastings ........... H01L 31/02021 361/93.2 |
| 2011/0273183 A1 | 11/2011 | Shea |
| 2012/0044600 A1 | 2/2012 | Roscoe et al. |
| 2012/0229939 A1 | 9/2012 | Mikani et al. |
| 2012/0280717 A1 | 11/2012 | Fu |
| 2013/0128396 A1* | 5/2013 | Danesh .................. G01R 19/00 361/45 |
| 2016/0072271 A1* | 3/2016 | Packard ............... H02H 1/0015 361/42 |
| 2016/0248240 A1 | 8/2016 | Miklis |
| 2018/0145497 A1* | 5/2018 | Jakupi ................. G01R 31/025 |
| 2019/0011492 A1* | 1/2019 | Handy ............... G01R 31/1272 |

FOREIGN PATENT DOCUMENTS

| | | |
|---|---|---|
| CN | 101842953 A | 9/2010 |
| CN | 102279339 A | 12/2011 |
| CN | 102375107 A | 3/2012 |
| CN | 102435917 A | 5/2012 |
| CN | 102749533 A | 10/2012 |
| CN | 102959410 A | 3/2013 |
| CN | 103415972 A | 11/2013 |
| CN | 103460540 A | 12/2013 |
| DE | 102004056436 A1 | 6/2006 |
| EP | 2424059 A2 | 2/2012 |
| EP | 2916455 A1 | 9/2015 |

OTHER PUBLICATIONS

German Office Action for German Patent Application No. 102016209443.2 dated Feb. 24, 2017.

Chinese Office Action and English translation thereof dated Jun. 27, 2019.

* cited by examiner

ACCIDENTAL ARC DETECTION UNIT AND METHOD THEREOF

PRIORITY STATEMENT

The present application hereby claims priority under 35 U.S.C. § 119 to German patent application number DE 102016209443.2 filed May 31, 2016, the entire contents of which are hereby incorporated herein by reference.

FIELD

At least one embodiment of the invention generally relates to an arc fault detection unit, a circuit breaker, a short circuiter and/or a method for arc fault detection.

BACKGROUND

In low-voltage circuits or low-voltage systems, respectively, or low-voltage mains, respectively, i.e. circuits for voltages of up to 1000 volts of AC voltage or 1500 volts of DC voltage, short circuits are for the most part associated with occurring arc faults, such as parallel or serial arc faults. In particular in high-performance distribution and switching systems, they can lead to disastrous destruction of operating equipment, system parts or complete switching systems, if not turned off sufficiently quickly. To avoid a longer-lasting and large-area failure of the power supply and to reduce bodily harm, it is necessary to detect such arc faults, in particular high-current or parallel arc faults, respectively, within a few milliseconds and to extinguish them. Conventional protective systems of power supply systems (e.g. fuses and circuit breakers) cannot provide reliable protection under the required time requirements.

Here, circuit breaker in particular refers to switches for low voltage. Circuit breakers are typically used, in particular in low-voltage systems, for currents of between 63 and 6300 amps. More specifically, closed circuit breakers, such as molded case circuit breakers, are used for currents of between 63 and 1600 amps, in particular of between 125 and 630 or 1200 amps. Open circuit breakers or air conduction switches, respectively, such as air circuit breakers, are in particular used for currents of between 630 and 6300 amps, more specifically of between 1200 and 6300 amps.

Circuit breakers in terms of embodiments of the invention can in particular have an electronic trip unit, identified in short as ETU.

Circuit breakers monitor the current flowing through them and interrupt the electric current or energy flow, respectively, to an energy sink or a consumer, respectively, which is identified as tripping, when current threshold values or current time span threshold values are exceeded, i.e. when a current value is present for a certain time span. The determination of tripping conditions and the tripping of a circuit breaker can take place via an electronic trip unit.

Short circuiters are special devices for short-circuiting lines or bars, respectively, in order to produce defined short circuits for protecting circuits or systems, respectively.

Conventional arc fault detection systems evaluate the light emission created by the arc and hereby detect the arc fault.

This has the disadvantage that optical waveguides or optical detection systems, respectively, must be installed parallel to the electrical lines or bars, respectively, in order to detect possibly occurring arc faults.

SUMMARY

An embodiment of the invention shows a possibility for arc fault detection.

An embodiment of the invention is directed to an arc fault detection unit; an embodiment is directed to a circuit breaker according; an embodiment is directed to a short circuiter; and an embodiment is directed to a method.

According to an embodiment of the invention, it is provided that an arc fault detection unit for an electrical low-voltage circuit has at least one voltage sensor assigned to the circuit, for periodically determining electrical voltage values (um) of the circuit, and at least one current sensor assigned to the circuit, for periodically determining electrical current magnitudes of the circuit, both of which are connected to an evaluation unit and are embodied in such a way that value pairs having a voltage value and a current magnitude are determined continuously. A value set comprises a plurality of value pairs and an arc voltage, which is compared to a first threshold value, is calculated from at least two value sets and if said first threshold value is exceeded in magnitude, an arc fault detection signal is output.

According to an advantageous embodiment of the invention, a circuit breaker for an electrical low-voltage circuit is further provided. This circuit breaker has an arc fault detection unit according to the invention. The arc fault detection unit is connected to the circuit breaker, wherein they are embodied in such a way that the circuit breaker trips, i.e. interrupts the electrical circuit, in response to an arc fault detection signal being output. An extinguishing of the arc fault can thus be attained. If the circuit breaker has an electronic trip unit, a very quick tripping of the circuit breaker can be attained when an arc fault detection signal is present.

According to an embodiment of the invention, a short circuiter having an arc fault detection unit, which is connected to the short circuiter, is further provided. They are embodied in such a way that the short circuiter short-circuits the electrical circuit in response to an arc fault detection signal being output in order to effect an extinguishing of the arc fault.

According to an embodiment of the invention, a method for arc fault detection for an electrical circuit, in particular low-voltage circuit, is further provided. Electrical voltage values and current values of the circuit are determined periodically herein, so that value pairs, having a voltage value and a current magnitude, are continuously present. A value set comprises a plurality of value pairs. An arc voltage, which is compared to a first threshold value, is calculated from (at least) two value sets and if said first threshold value is exceeded, an arc fault detection signal is output.

Advantageous embodiments of the invention are specified in the claims.

All embodiments and features of the invention, alone as well as in mutual interaction, effect an improvement of the detection of arc faults or the extinguishing thereof, respectively.

BRIEF DESCRIPTION OF THE DRAWINGS

The described characteristics, features and advantages of this invention, as well as the way in which they are attained, become clearer and more easily understandable in the context of the following description of the example embodiments, which will be explained in more detail in the context of the drawings.

In the figures.

DETAILED DESCRIPTION OF THE EXAMPLE EMBODIMENTS

Figure 1:
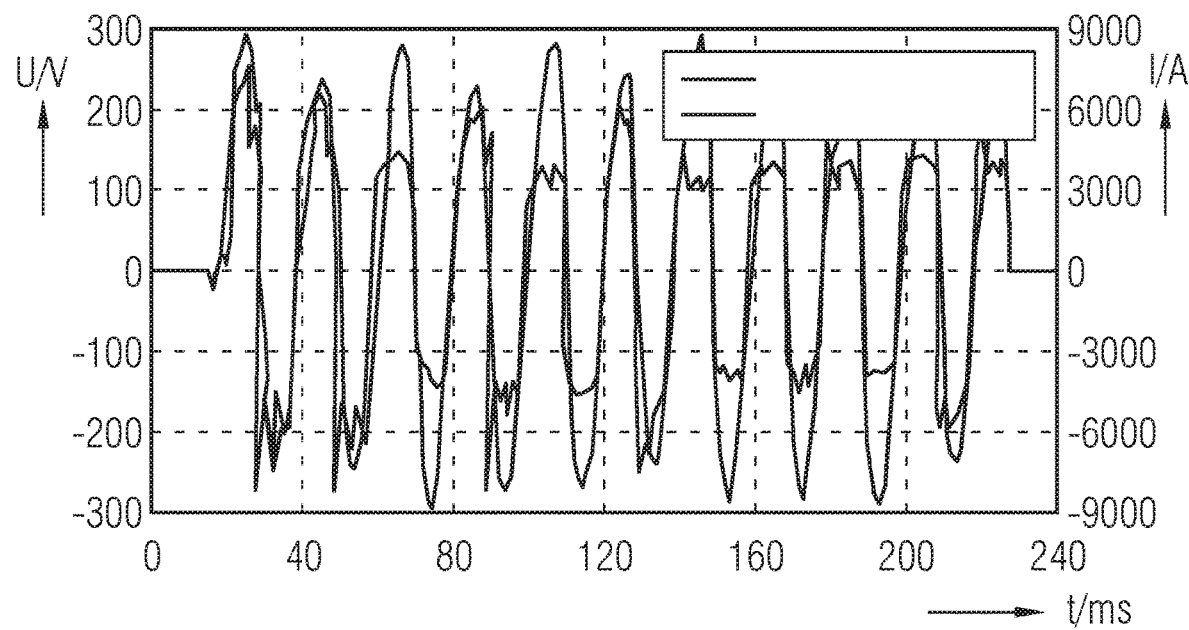
FIG. 1 shows a diagram of the temporal voltage and current curve after arc ignition

In the following, embodiments of the invention are described in detail with reference to the accompanying drawings. It is to be understood that the following description of the embodiments is given only for the purpose of illustration and is not to be taken in a limiting sense. It should be noted that the drawings are to be regarded as being schematic representations only, and elements in the drawings are not necessarily to scale with each other. Rather, the representation of the various elements is chosen such that their function and general purpose become apparent to a person skilled in the art.

The drawings are to be regarded as being schematic representations and elements illustrated in the drawings are not necessarily shown to scale. Rather, the various elements are represented such that their function and general purpose become apparent to a person skilled in the art. Any connection or coupling between functional blocks, devices, components, or other physical or functional units shown in the drawings or described herein may also be implemented by an indirect connection or coupling. A coupling between components may also be established over a wireless connection. Functional blocks may be implemented in hardware, firmware, software, or a combination thereof.

Various example embodiments will now be described more fully with reference to the accompanying drawings in which only some example embodiments are shown. Specific structural and functional details disclosed herein are merely representative for purposes of describing example embodiments. Example embodiments, however, may be embodied in various different forms, and should not be construed as being limited to only the illustrated embodiments. Rather, the illustrated embodiments are provided as examples so that this disclosure will be thorough and complete, and will fully convey the concepts of this disclosure to those skilled in the art. Accordingly, known processes, elements, and techniques, may not be described with respect to some example embodiments. Unless otherwise noted, like reference characters denote like elements throughout the attached drawings and written description, and thus descriptions will not be repeated. The present invention, however, may be embodied in many alternate forms and should not be construed as limited to only the example embodiments set forth herein.

It will be understood that, although the terms first, second, etc. may be used herein to describe various elements, components, regions, layers, and/or sections, these elements, components, regions, layers, and/or sections, should not be limited by these terms. These terms are only used to distinguish one element from another. For example, a first element could be termed a second element, and, similarly, a second element could be termed a first element, without departing from the scope of example embodiments of the present invention. As used herein, the term "and/or," includes any and all combinations of one or more of the associated listed items. The phrase "at least one of" has the same meaning as "and/or".

Spatially relative terms, such as "beneath," "below," "lower," "under," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below," "beneath," or "under," other elements or features would then be oriented "above" the other elements or features. Thus, the example terms "below" and "under" may encompass both an orientation of above and below. The device may be otherwise oriented (rotated 90 degrees or at other orientations) and the spatially relative descriptors used herein interpreted accordingly. In addition, when an element is referred to as being "between" two elements, the element may be the only element between the two elements, or one or more other intervening elements may be present.

Spatial and functional relationships between elements (for example, between modules) are described using various terms, including "connected," "engaged," "interfaced," and "coupled." Unless explicitly described as being "direct," when a relationship between first and second elements is described in the above disclosure, that relationship encompasses a direct relationship where no other intervening elements are present between the first and second elements, and also an indirect relationship where one or more intervening elements are present (either spatially or functionally) between the first and second elements. In contrast, when an element is referred to as being "directly" connected, engaged, interfaced, or coupled to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting of example embodiments of the invention. As used herein, the singular forms "a," "an," and "the," are intended to include the plural forms as well, unless the context clearly indicates otherwise. As used herein, the terms "and/or" and "at least one of" include any and all combinations of one or more of the associated listed items. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Also, the term "exemplary" is intended to refer to an example or illustration.

When an element is referred to as being "on," "connected to," "coupled to," or "adjacent to," another element, the element may be directly on, connected to, coupled to, or adjacent to, the other element, or one or more other intervening elements may be present. In contrast, when an element is referred to as being "directly on," "directly connected to," "directly coupled to," or "immediately adjacent to," another element there are no intervening elements present.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

Before discussing example embodiments in more detail, it is noted that some example embodiments may be described with reference to acts and symbolic representations of operations (e.g., in the form of flow charts, flow diagrams, data flow diagrams, structure diagrams, block diagrams, etc.) that may be implemented in conjunction with units and/or devices discussed in more detail below. Although discussed in a particularly manner, a function or operation specified in a specific block may be performed differently from the flow specified in a flowchart, flow diagram, etc. For example, functions or operations illustrated as being performed serially in two consecutive blocks may actually be performed simultaneously, or in some cases be performed in reverse order. Although the flowcharts describe the operations as sequential processes, many of the operations may be performed in parallel, concurrently or simultaneously. In addition, the order of operations may be re-arranged. The processes may be terminated when their operations are completed, but may also have additional steps not included in the figure. The processes may correspond to methods, functions, procedures, subroutines, subprograms, etc.

Specific structural and functional details disclosed herein are merely representative for purposes of describing example embodiments of the present invention. This invention may, however, be embodied in many alternate forms and should not be construed as limited to only the embodiments set forth herein.

Although described with reference to specific examples and drawings, modifications, additions and substitutions of example embodiments may be variously made according to the description by those of ordinary skill in the art. For example, the described techniques may be performed in an order different with that of the methods described, and/or components such as the described system, architecture, devices, circuit, and the like, may be connected or combined to be different from the above-described methods, or results may be appropriately achieved by other components or equivalents.

According to an embodiment of the invention, it is provided that an arc fault detection unit for an electrical low-voltage circuit has at least one voltage sensor assigned to the circuit, for periodically determining electrical voltage values (um) of the circuit, and at least one current sensor assigned to the circuit, for periodically determining electrical current magnitudes of the circuit, both of which are connected to an evaluation unit and are embodied in such a way that value pairs having a voltage value and a current magnitude are determined continuously. A value set comprises a plurality of value pairs and an arc voltage, which is compared to a first threshold value, is calculated from at least two value sets and if said first threshold value is exceeded in magnitude, an arc fault detection signal is output.

Exceeding in magnitude refers to exceeding, in the case of which exceeding could take place with respect to a positive first threshold value and/or undershooting could take place with respect to a negative fourth threshold value, analogous to a comparison by magnitude of the arc voltage to a (positive) threshold value, which can, of course, also occur.

The sensors can be arranged externally here and do not have to be arranged in the housing of the arc fault detection unit. The periodic or continuous determination of value pairs of a voltage value and of a current magnitude, in particular at a point in time, can be carried out, for example, by sampling the corresponding values.

This has the particular advantage that a simple and secure possibility for arc fault detection is provided.

Advantageous embodiments of the invention are specified in the claims.

In an advantageous embodiment of the invention, the arc voltage is calculated from three value sets.

This has the particular advantage that particularly accurate determination of the arc voltage is made possible in order to detect arc faults more reliably in this way.

In an advantageous embodiment of the invention, the electrical current magnitude is either an electrical current value ($i_m$) or a value for the change of the electrical current according to the time ($i'_m$). This has the particular advantage that only one current magnitude, either current value or change of the electrical current according to the time, or the discharge of the current according to the time, respectively, needs to be determined. For example, a Rogowski coil can advantageously be used to determine the current magnitude, whereby the change of the current is determined according to the time.

In an advantageous embodiment of the invention, if the electrical current value ($i_m$) is determined, a value for the change of the electrical current according to the time ($i'_m$) or the first discharge of the current value according to the time, respectively, is determined therefrom or if the value for the change of the electrical current according to the time ($i'_m$) is determined, the electrical current value ($i_m$) is determined therefrom. A value pair thus advantageously has a voltage value ($u_m$), a current value ($i_m$) and a value for the change of the current according to the time ($i'_m$), by means of which the arc voltage (Ulb) can be calculated. The three values of a value pair can also be determined, sampled or measured in parallel.

In an advantageous embodiment of the invention, the evaluation unit is embodied in such a way that the calculation of the arc voltage (Ulb) is carried out with the help of an integral equation or the solution thereof.

This has the particular advantage that a comprehensive calculation possibility, which takes many parameters of an actual circuit into account, is available.

In an advantageous embodiment of the invention, the evaluation unit is configured in such a way that a value pair is assigned to just one value set.

This has the particular advantage that particularly accurate calculation is made possible, since redundancies of the determined value pairs in different value sets are ruled out.

In an advantageous embodiment of the invention, the evaluation unit is embodied in such a way that each value set has a fixed number of value pairs.

This has the particular advantage that a simple possibility for cyclical calculation of the arc voltage is provided, since the same number of value pairs can be evaluated at each pass.

In an advantageous embodiment of the invention, the evaluation unit is evaluated in such a way that the value pairs are continuously assigned to a value set until the fixed number of value pairs is reached and the following value pairs are assigned to the next value set.

This has the particular advantage that both more accurate and also cyclical determination of the arc voltage is made possible.

In an advantageous embodiment of the invention, the evaluation unit is configured in such a way that the electrical voltage values and/or current magnitudes are determined with a fixed time interval (dt).

This in turn has the particular advantage that particularly accurate determination of the arc voltage or of an arc fault is made possible.

In an advantageous embodiment of the invention, the evaluation unit is configured in such a way that for the calculation of the arc voltage ($U_{lb}$) from a value set at least one of the following terms is formed:

a) a time voltage sum product (us), formed from the time interval (dt) and the sum of the voltage values (um), wherein the sum of the voltage values is formed by half the first voltage value, half the last voltage value and the sum of the other voltage values of the value set;

b) a time current sum product (is), formed from the time interval (dt) and the sum of the current values, wherein the sum of the current values is formed by half the first current value, half the last current value and the sum of the other current values of the value set;

c) a time current change value product (i's), formed from the time interval (dt) and the sum of the values for the change in current over the time, wherein the sum of the values for the change in the current over the time is formed by half the first value, half the last value and the sum of the other values of the value set;

d) a time sign value product (ss), formed from the time interval (dt) and the sum of the sign values of the current values, wherein a sign value assumes the value plus one in the case of a positive current value, minus one in the case of a negative current value and zero in the case of a current value of zero, wherein the sum of the sign values is formed from half the sign value of the first current value, half the sign value of the last current value and the sum of the sign values of the other current values.

This has the particular advantage that a determination of the arc fault voltage is made possible via at least one of these terms.

In an advantageous embodiment of the invention, the evaluation unit is embodied in such a way that a sign value of the current value assumes the value zero if the absolute value of the voltage value of this value pair undershoots a second threshold value. That is to say the result of the sign function or signum function is always set to zero if the absolute value of the simultaneous voltage value is less than or equal to the second threshold value. For example an anode-cathode voltage drop of approximately 20 V can be assumed as a typical threshold value for this, since it can be presumed that an arc cannot occur below this second threshold value.

By introducing this secondary condition for the calculation of the signum function, instabilities in the calculation of the arc voltage are significantly minimized in the case of arc ignition. This has the particular advantage that more accurate calculation results are present in particular at and after the arc ignition, and therefore better arc fault detection is made possible.

In an advantageous embodiment of the invention, the evaluation unit is embodied in such a way that for the calculation of the arc voltage ($U_{lb}$) for two successive value sets in each case the following terms are formed:

a first time voltage sum product (us1) and a second time voltage sum product (us2), a first time current sum product (is1) and a second time current sum product (is2), a first time current change value product (i's1) and a second time current change value product (i's2), a first time sign value product (ss1) and a second time sign value product (ss2) are calculated.

This has the particular advantage that simple, in particular integrating, determination of the arc fault voltage is made possible.

In an advantageous embodiment of the invention, the evaluation unit is embodied in such a way that for the calculation of the arc voltage ($U_{lb}$) for three successive value sets in each case the following terms are formed:

a first time voltage sum product (us1), a second time voltage sum product (us2) and a third time voltage sum product (us3), a first time current sum product (is1), a second time current sum product (is2) and a third time current sum product (is3), a first time current change value product (i's1), a second time current change value product (i's2) and a third time current change value product (i's3), a first time sign value product (ss1), a second time sign value product (ss2) and a third time sign value product (ss3) are calculated.

This has the particular advantage that simple and more accurate, in particular integrating, determination of the arc fault voltage is made possible.

In an advantageous embodiment of the invention, the evaluation unit is embodied in such a way that at least one of the following terms is formed for calculating the arc voltage ($U_{lb}$):

a first product (P1), formed from the third time voltage sum product (us3) and the second time current sum product (is2), a second product (P2), formed from the second time voltage sum product (us2) and the third time current sum product (is3), a third product (P3), formed from the second time current change value product (i's2) and the first time current sum product (is1), a fourth product (P4), formed from the first time current change value product (i's1) and the second time current sum product (is2), a fifth product (P5), formed from the second time voltage sum product (us2) and the first time current sum product (is1), a sixth product (P6), formed from the first time voltage sum product (us1) and the second time current sum product (is2), a seventh product (P7), formed from the third time current change value product (i's3) and the second time current sum product (is2), an eighth product (P8), formed from the second time current change value product (i's2) and the third time current sum product (is3), a ninth product (P9), formed from the first time sign value product (ss1) and the second time current sum product (is2), a tenth product (P10), formed from the second time sign value product (ss2) and the first time current sum product (is1), an eleventh product (P11), formed from the second time sign value product (ss2) and the third time current sum product (is3), a twelfth product (P12), formed from the third time sign value product (ss3) and the second time current sum product (is2), a first difference (D1), the minuend of which is the first product (P1) and the subtrahend of which is the second product (P2), a second difference (D2), the minuend of which is the third product (P3) and the subtrahend of which is the fourth product (P4), a third difference (D3), the minuend of which is the fifth product (P5) and the subtrahend of which is the sixth product (P6), a fourth difference (D4), the minuend of which is the seventh product (P7) and the subtrahend of which is the eighth product (P8), a fifth difference (D5), the minuend of which is the ninth product (P9) and the subtrahend of which is the tenth product (P10), a sixth difference (D6), the minuend of which is the eleventh product (P11) and the subtrahend of which is the twelfth product (P12), a thirteenth product (P13), formed from the first difference (D1) and the second difference (D2), a fourteenth product (P14), formed from the third difference (D3) and the fourth difference (D4), a fifteenth product (P15), formed from the fifth difference (D5) and the fourth difference (D4), a sixteenth product (P16), formed from the sixth difference (D6) and the second difference (D2), a seventh difference (D7), the minuend of which is the thirteenth product (P13) and the subtrahend of which is the fourteenth product (P14), an eighth difference (D8), the minuend of which is the fifteenth product (P15) and the subtrahend of which is the sixteenth product (P16).

This has the particular advantage that a determination, in particular based on an integrating approach, of the arc fault voltage is made possible by means of at least one of these terms.

In an advantageous embodiment of the invention, the evaluation unit is embodied in such a way that the arc voltage (Ulb) is a quotient, the dividend of which has the seventh difference (D7) and the divisor of which has the eighth difference (D8).

This has the particular advantage that a very exact determination of an arc fault voltage is made possible.

In an advantageous embodiment of the invention, the evaluation unit is embodied in such a way that the arc voltage (Ulb) is set to the value zero if the sum of the first time sign value product (ss1), second time sign value product (ss2) and third time sign value product (ss3) is equal to zero.

This has the particular advantage that unacceptable calculation results during the calculation of the arc voltage are avoided. These results can occur if the three time sign value products (ss1, ss2, ss3) are each zero. In this case, the arc voltage is set to the value zero.

According to an advantageous embodiment of the invention, a circuit breaker for an electrical low-voltage circuit is further provided. This circuit breaker has an arc fault detection unit according to the invention. The arc fault detection unit is connected to the circuit breaker, wherein they are embodied in such a way that the circuit breaker trips, i.e. interrupts the electrical circuit, in response to an arc fault detection signal being output. An extinguishing of the arc fault can thus be attained. If the circuit breaker has an electronic trip unit, a very quick tripping of the circuit breaker can be attained when an arc fault detection signal is present.

This has the particular advantage that a circuit breaker is expanded by a further, advantageous functionality for the protection of electrical systems. Arc faults are thereby advantageously detected and turned off in one device. If applicable, available assembly groups, such as voltage and/or current sensors, power supply, microprocessors for the evaluation unit, etc. can also be used and can thus achieve synergies.

According to an embodiment of the invention, a short circuiter having an arc fault detection unit, which is connected to the short circuiter, is further provided. They are embodied in such a way that the short circuiter short-circuits the electrical circuit in response to an arc fault detection signal being output in order to effect an extinguishing of the arc fault.

This has the particular advantage that a simple, quick and effective possibility for extinguishing arc faults is available.

According to an embodiment of the invention, a method for arc fault detection for an electrical circuit, in particular low-voltage circuit, is further provided. Electrical voltage values and current values of the circuit are determined periodically herein, so that value pairs, having a voltage value and a current magnitude, are continuously present. A value set comprises a plurality of value pairs. An arc voltage, which is compared to a first threshold value, is calculated from (at least) two value sets and if said first threshold value is exceeded, an arc fault detection signal is output.

This has the advantage that a simple method for detecting an arc fault is given.

All embodiments and features of the invention, alone as well as in mutual interaction, effect an improvement of the detection of arc faults or the extinguishing thereof, respectively.

In a circuit or mains, respectively, in which an arc fault burns, a current and voltage curve can be measured, which has a significant course. A typical voltage and current curve for an arc fault is illustrated in FIG. 1. FIG. 1 shows an illustration of a diagram, in which the temporal curve of the electrical voltage U and of the electrical current I after ignition of an arc or arc fault, respectively, in particular parallel arc fault, is illustrated in an electrical circuit, in particular low-voltage circuit.

The time t is illustrated on the horizontal X-axis in milliseconds (ms). The magnitude of the electrical voltage U is illustrated on the vertical Y-axis on the left scaling in volts (V). On the right scaling, the magnitude of the electrical current I is illustrated in amps (A).

Electrical voltage values um and electrical current values $i_m$ are determined continuously or periodically, respectively, for example by means of one sensor each. For example the electrical current $i_m$ in this case can be measured directly. In the alternative, the change of the current according to the time $i'_m$ can be measured as well. If the electrical current $i_m$ is measured, the change of the current according to the time $i'_m$ can be determined therefrom, for example by differentiation of the current value $i_m$. If the change of the electrical current according to the time $i'_m$ is measured, the electrical current $i_m$ can be determined therefrom, for example by integrating the change of the electrical current according to the time $i'_m$. The measurement of the change of the electrical current according to the time $i'_m$ can take place for example by means of a Rogowski coil. In the case of sinusoidal flows in the circuit, the integration can be realized particularly easily, because the integral of the sign is a cosine and the integral of the cosine is a sign.

The current value $i_m$ and the change of the current according to the time $i'_m$ can likewise also be measured in parallel, e.g. via 2 sensors. A conversion is thus not necessary.

Voltage values $u_m$ and current values $i_m$ or voltage values $u_m$ and values for the change of the electrical current according to the time $i'_m$, respectively, are determined time and again with a time lag, for example a fixed time lag dt. The determination in this case can take place by sampling the values. The sampling frequency or measuring frequency, respectively, in this case should be a multiple of the frequency of the measured alternating quantities. For example in the case of common electricity grids, for example with 50 Hz or 60 Hz, respectively, the measuring frequency could be in the kilohertz range, for example between 1 and 200 kHz, more specifically 10 to 40 or 100 kHz, in particular in the range of 40-50 kHz.

For example a voltage value and a current magnitude are therein in each case determined at a point in time, which is in particular identical. With respect to the current magnitude, two values of the current magnitude, such as current value and change of the current value according to the time, can also be determined in parallel.

Figure 2:
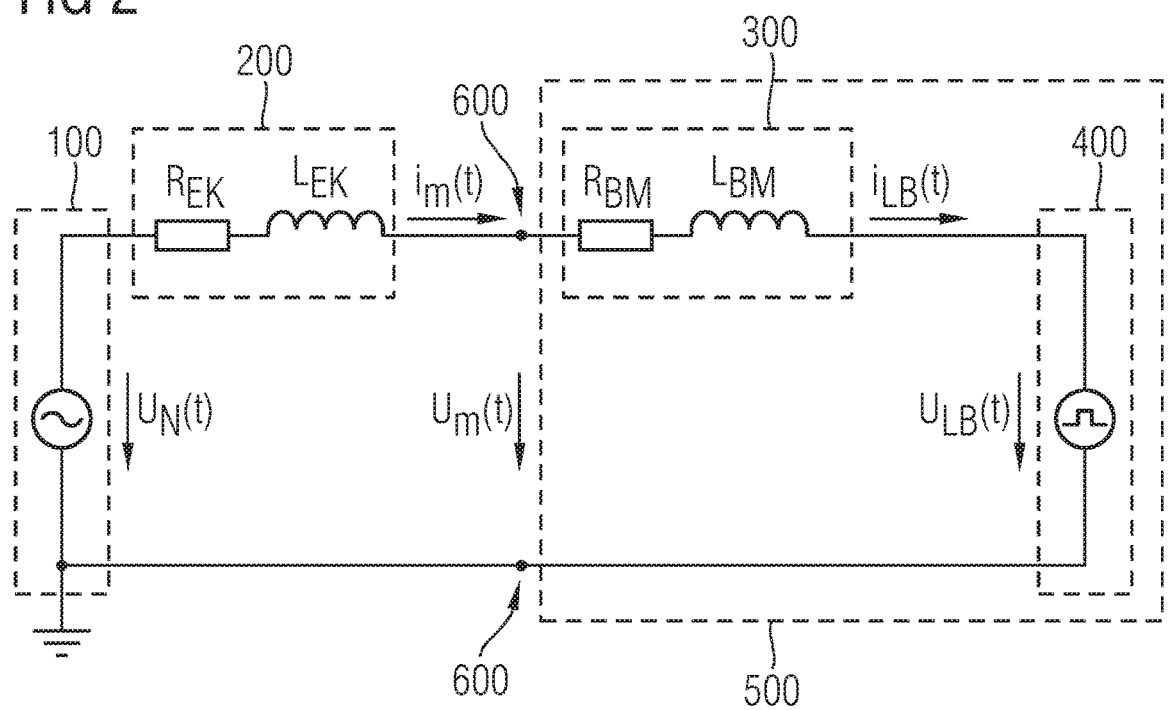
FIG. 2 shows an equivalent circuit diagram of an electrical circuit

FIG. 2 shows an equivalent circuit diagram of an electrical circuit, having an electrical power source 100, which provides an electrical supply voltage $u_n(t)$, a mains access connected thereto or a supply cable 200, illustrated by electrical equivalent circuit elements, such as a supply cable resistor $R_{ek}$ and a supply cable inductor or coil $L_{ek}$, respectively, which is followed by an electrical consumer, operating means or energy sink 300, respectively, illustrated in turn by electrical equivalent circuit elements, such as a consumer resistor $R_{BM}$ and a consumer inductor or coil $L_{BM}$, respectively. An electrical voltage $u_m(t)$ and an electrical current magnitude, such as the electrical current value $i_m(t)$ and/or the change of the current according to the time $i'_m(t)$, or the first discharge of the current according to the time, respectively, can be measured between supply cable 200 and consumer 300. These magnitudes are captured at the measuring points 600, in order to be further processed in the arc fault detection unit.

The area monitored with respect to arc faults is illustrated by a dashed line 500.

An arc fault, which is illustrated by an arc 400 comprising an arc voltage $U_{lb}(t)$, can appear in the electrical circuit. According to the invention, an arc voltage $U_{lb}$ is calculated continuously in the arc fault detection unit with the help of the measured/sampled voltage $u_m(t)$ and the measured/sampled current magnitude (current and/or current change).

According to an embodiment of the invention, the voltage, the current and the change of the current according to the time are used for the calculation. For this purpose, such a value pair is assigned to at least one value set. In one preferred embodiment, a value pair is assigned to precisely one value set. It is essential that a value set contains at least one value pair which is not contained in the preceding or following value set.

According to an embodiment of the invention, an arc voltage is calculated from at least two value sets.

In one preferred embodiment, a fixed number of value pairs, which are, for example, determined in chronological succession, for example at a fixed time interval, are assigned to a value set. For example, a value set contains 10 value pairs. The first 10 value pairs are assigned to the first value set. The second 10 value pairs are assigned to the second value set, and the third 10 value pairs are assigned to the third value set etc.

In each case at least 2 value sets are used for the determination of an arc voltage or of an arc fault. The calculation is carried out continuously, i.e. for example a first calculation with the values sets 1 and 2 or 1 to 3, and a second calculation according to the invention with the value sets 2 and 3 or 2 to 4 etc. (the first information is for calculation with 2 value sets and the second information is for calculation with 3 value sets).

1ST EXAMPLE

For example, value pairs of 1 to x ($x \geq 32$; $x \in \mathbb{N}$) are sampled and a value set is composed of 10 value pairs. In each case 3 value sets are used for the determination of an arc voltage or of an arc fault.

The value pairs 1-10 are assigned to the value set 1.
The value pairs 11-20 are assigned to the value set 2.
The value pairs 21-30 are assigned to the value set 3.

The calculation is carried out continuously, i.e. for example the first calculation according to an embodiment of the invention with the value pairs 1 to 30, the second calculation according to the invention with the value pairs 2 to 31, the third calculation according to an embodiment of the invention with the value pairs 3 to 32 etc. In this way, a calculation result for the subsequent evaluation is available at each sampling point.

2ND EXAMPLE

Value sets can also be superimposed on one another for the calculation. That is to say two value sets can use one or more identical value pairs. In this context, the principle applies that each value set must contain at least one further value pair which is not used in the other value sets. For example, value pairs of 1 to x ($x \geq 14$; $x \in \mathbb{N}$) are sampled and a value set is composed of 10 value pairs. In each case 3 value sets are used for the determination of an arc voltage or of an arc fault.

The value pairs 1-10 are assigned to the value set 1.
The value pairs 2-11 are assigned to the value set 2.
The value pairs 3-12 are assigned to the value set 3.

The calculation is carried out continuously, i.e. for example a first calculation according to an embodiment of the invention with the value pairs 1 to 12, a second calculation according to an embodiment of the invention with the value pairs 2 to 13, a third calculation according to an embodiment of the invention with the value pairs 3 to 14 etc. Therefore, a calculation result for the subsequent evaluation is available at each sampling point.

3RD EXAMPLE

For the calculation the value sets can also have a different magnitude. For example, value pairs of 1 to x ($x \geq 17$; $x \in \mathbb{N}$) are sampled. In each case, 3 value sets are used for the determination of an arc voltage or of an arc fault, wherein the 1st value set is composed of 6 value pairs, the 2nd value set is composed of 15 value pairs and the 3rd value set is composed of 9 value pairs.

The value pairs 1-6 are assigned to the value set 1.
The value pairs 1-15 are assigned to the value set 2.
The value pairs 6-15 are assigned to the value set 3.

The calculation is carried out continuously, i.e. for example a first calculation according to an embodiment of the invention with the value pairs 1 to 15; the three value sets are contained therein. The second calculation according to an embodiment of the invention with the value pairs 2 to 16 and third calculation according to an embodiment of the invention with the value pairs 3 to 17 etc. Therefore, a calculation result for the subsequent evaluation is available at each sampling point.

For example, the value pairs can subsequently also be arranged in succession and be at an interval of a specific number of value pairs from one another.

The calculation is carried out in that certain terms (mathematical expressions or equations, respectively), are calculated continuously.

The calculation of these terms is based on a solution of the line equation of the first order:

$$u_m(t) = R_{BM} \cdot i_m(t) + L_{BM} \frac{di_m(t)}{dt} \tag{1}$$

Under the assumption that an arc fault is present in the low-voltage mains, the electrical behavior would be comparable to that of a counter-voltage source in the mains.

The following, expanded ansatz differential equation results from this:

$$u_m(t) = R_{BM} \cdot i_m(t) + L_{BM} \frac{di_m(t)}{dt} + u_{LB}(t) \tag{2}$$

The arc fault is illustrated in a simplified manner as a purely ohmic consumer. It is thus assumed that the arc voltage is in-phase with the arc current. The arc voltage can thus be described by means of the following equation:

$$U_{LB}(t) = U_{LB} \cdot \text{sign}(i_{LB}(t)) \tag{3}$$

If it is assumed that the measuring current $i_m(t)$ corresponds to the arc fault current $i_{LB}(t)$, thus that no current branching is present between measuring location and arc fault lighting point, it can be stated:

$$u_m(t) = R_{BM} \cdot i_m(t) + L_{BM} \frac{di_m(t)}{dt} + \text{sign}(i_m(t)) \cdot U_{LB} \tag{4}$$

To solve this expanded ansatz differential equation, an integrating solution method is used according to an embodiment of the invention. This results in a complete integrating ansatz:

$$\int u_m(t)dt = R_{BM} \int i_m(t)dt + L_{BM} \int \frac{di_m(t)}{dt}dt + U_{LB} \int \text{sign}(i_m(t))dt \tag{5}$$

The calculation of the arc voltage is then carried out by transposing and resolving the equation (5) according to $U_{LB}$.

The following ansatz equation is used for the calculation:

$$\int u_m(t)dt = R_{BM} \int i_m(t)dt + L_{BM} \int \frac{di_m(t)}{dt}dt + U_{LB} \int \text{sign}(i_m(t))dt = \tag{6}$$

-continued $$R_{BM} \int i_m(t)dt + L_{BM} \int i'_m(t)dt + U_{LB} \int \text{sign}(i_m(t))dt$$

For example, the trapezoidal rule method according to equation (7) is used for the numerical integration.

$$\int_{t_A}^{t_E} f(t)dt \approx \frac{\Delta t}{2}\left[f(t_A) + 2\sum_{v=1}^{\frac{t_E-t_A}{\Delta t}-1} f(t_A + v \cdot \Delta t) + f(t_E)\right] \tag{7}$$

For a simplified presentation of the solution, the integration intervals which are solved with trapezoidal rules are substituted by the following terms:

$$u_s = \frac{\Delta t}{2}\left[u_m(t_A) + 2\sum_{v=1}^{\frac{t_E-t_A}{\Delta t}-1} u_m(t_A + v \cdot \Delta t) + u_m(t_E)\right] \tag{8}$$

$$i_s = \frac{\Delta t}{2}\left[i_m(t_A) + 2\sum_{v=1}^{\frac{t_E-t_A}{\Delta t}-1} i_m(t_A + v \cdot \Delta t) + i_m(t_E)\right] \tag{9}$$

$$i'_s = \frac{\Delta t}{2}\left[i'_m(t_A) + 2\sum_{v=1}^{\frac{t_E-t_A}{\Delta t}-1} i'_m(t_A + v \cdot \Delta t) + i'_m(t_E)\right] \tag{10}$$

$$s_s = \frac{\Delta t}{2}\left[\text{sign}(i_m(t_A)) + 2\sum_{v=1}^{\frac{t_E-t_A}{\Delta t}-1} \text{sign}(i_m(t_A + v \cdot \Delta t)) + \text{sign}(i_m(t_E))\right] \tag{11}$$

$$t_s = \frac{t_E - t_A}{\Delta t}$$

The value is here the number of value pairs per value set, $\Delta t$ corresponds to the reference sign dt which corresponds to the time interval between the sampled voltage values or current magnitudes or value pairs.

The variable $t_E$ corresponds to the time of the chronologically last value pair of a value set, $t_A$ corresponds to the time of the chronologically first value pair of the value set.

The following terms are respectively calculated for a value set with the formulas 8 to 11:

(8) a time voltage sum product ($u_s$), formed from the time interval (dt) and the sum of the voltage values ($u_m$), wherein the sum of the voltage values is formed by half the first voltage value, half the last voltage value and the sum of the other voltage values of the value set.

(9) a time current sum product ($i_s$), formed from the time interval (dt) and the sum of the current values, wherein the sum of the current values is formed by half the first current value, half the last current value and the sum of the other current values of the value set.

(10) a time current change value product (i's), formed from the time interval (dt) and the sum of the values for the change in the current according to the time, wherein the sum of the values for the change in the current according to the time is formed by half the first value, half the last value and the sum of the other values of the value set.

(11) a time sign value product ($s_s$), formed from the time interval (dt) and the sum of the sign values of the current values, wherein a sign value assumes the value plus one in the case of a positive current value, minus one in the case of a negative current value and zero in the case of the current value zero, wherein the sum of the sign values is formed from half the sign value of the first current value, half the sign value of the last current value and the sum of the sign values of the other current values.

The equation system corresponding to the ansatz equation 5 is obtained with the substituted values as:

$$u_s = R_{BM} i_s + L_{BM} i'_s + U_{LB} s_s \quad (5)$$

The equation system contains the three unknown variables $R_{BM}$, $L_{BM}$, and $U_{LB}$. For the solution, (at least) two integration limits which are chronologically different from one another are used and three for a very accurate determination, for example by using according to the invention two or three value sets:

$$u_{s1} = R_{BM} i_{s1} + L_{BM} i'_{s1} + U_{LB} s_{s1}$$

$$u_{s2} = R_{BM} i_{s2} + L_{BM} i'_{s2} + U_{LB} s_{s2}$$

$$u_{s3} = R_{BM} i_{s3} + L_{BM} i'_{s3} + U_{LB} s_{s3} \quad (6)$$

The arc voltage $U_{LB}$ can consequently be calculated according to the invention, for example, with the following formula.

$$U_{LB} = \frac{\begin{array}{c}(u_{s3} i_{s2} - u_{s2} i_{s3})(i'_{s2} i_{s1} - i'_{s1} i_{s2}) - \\ (u_{s2} i_{s1} - u_{s1} i_{s2})(i'_{s3} i_{s2} - i'_{s2} i_{s3})\end{array}}{\begin{array}{c}(s_{s1} i_{s2} - s_{s2} i_{s1})(i'_{s3} i_{s2} - i'_{s2} i_{s3}) - \\ (s_{s2} i_{s3} - s_{s3} i_{s2})(i'_{s2} i_{s1} - i'_{s1} i_{s2})\end{array}} \quad (7)$$

Wherein $u_s$, $i_e$, $i'_s$, $s_s$ are the time voltage sum products, time current sum products, time current change value products, time sign value products, according to formulas 8 to 11, a first, second and a third value set, according to the index.

The abbreviation sign or sgn represents the signum function or sign function, respectively. This function assigns a number its sign. This is defined as follows:
sign(x)=+1, if x>0;
sign(x)=0, if x=0;
sign(x)=−1, if x<0.

Formula 14 is composed of 12 products P1, . . . , P12 which contain:
a) Products of time voltage sum products $u_s$ and time current sum products $i_s$,
b) Products of time current sum products $i_s$ and time current change value products $i'_s$,
c) Products of time sign value products $s_s$ and time current sum products $i_s$.

$$U_{LB} = \frac{(P1 - P2)(P3 - P4) - (P5 - P6)(P7 - P8)}{(P9 - P10)(P7 - P8) - (P11 - P12)(P3 - P4)} \quad (15)$$

$$U_{LB} = \frac{D1 * D2 - D3 * D4}{D5 * D4 - D6 * D2} \quad (16)$$

$$U_{LB} = \frac{P13 - P14}{P15 - P16} \quad (17)$$

$$U_{LB} = \frac{D7}{D8} \quad (18)$$

The 12 products form 6 various differences D1, . . . , D6.
The 6 differences D1, . . . , D6 in turn form 4 superordinate products P13, . . . , P16. These in turn form 2 superordinate differences D7, D8, which can be used to determine an arc voltage. If the latter exceeds a first threshold value SW1, an arc fault detection signal SLES is output.

The arc voltage can also be calculated, for example, with the following simplified formulas, which are also solutions of the integral equation. In this context, according to the invention only two value sets are required for the determination.

$$U_{LB} = \frac{u_{s2} i_{s1} - u_{s1} i_{s2}}{t_{s2} i_{s1} - t_{s1} i_{s2}} = \frac{P5 - P6}{P17 - P18} = \frac{D3}{D9}$$

$$U_{LB} = \frac{u_{s2} i_{s1} - u_{s1} i_{s2}}{s_{s2} i_{s1} - s_{s1} i_{s2}} = \frac{P5 - P6}{P10 - P9} = \frac{D3}{D10}$$

$$U_{LB} = \frac{u_{s2} i'_{s1} - u_{s1} i'_{s2}}{t_{s2} i'_{s1} - t_{s1} i'_{s2}} = \frac{P19 - P20}{P21 - P22} = \frac{D11}{D12}$$

$$U_{LB} = \frac{u_{s2} i'_{s1} - u_{s1} i'_{s2}}{s_{s2} i'_{s1} - s_{s1} i'_{s2}} = \frac{P19 - P20}{P23 - P24} = \frac{D11}{D13}$$

A further example calculation using three value sets is given in the following formula.

$$U_{LB} = \frac{\begin{array}{c}(u_{s2} i_{s1} - u_{s1} i_{s2})(i'_{s3} i_{s1} - i'_{s1} i_{s3}) - \\ (u_{s3} i_{s1} - u_{s1} i_{s3})(i'_{s2} i_{s1} - i'_{s1} i_{s2})\end{array}}{\begin{array}{c}(t_{s1} i_{s3} - u_{s3} i_{s1})(i'_{s2} i_{s1} - i'_{s1} i_{s2}) - \\ (t_{s1} i_{s2} - t_{s2} i_{s1})(i'_{s3} i_{s1} - i'_{s1} i_{s3})\end{array}}$$

$$U_{LB} = \frac{(P5 - P6)(P25 - P26) - (P27 - P28)(P3 - P4)}{(P29 - P30)(P3 - P4) - (P18 - P17)(P25 - P26)}$$

$$U_{LB} = \frac{D3 D14 - D15 D2}{D16 D2 - D17 D14}$$

$$U_{LB} = \frac{P31 - P32}{P33 - P34}$$

$$U_{LB} = \frac{D18}{D19}$$

Each solution of the integral equation, also a simplified one, constitutes an inventive use of an embodiment of the invention.

For a secure detection of an arc fault, it is necessary to differentiate the operating case—system without arc fault—from the error case—system with arc fault. The arc fault voltage is recalculated for each sampled value by way of an embodiment of the invention at hand. The differentiation between the states: a) arc fault present and b) no arc fault present is made by way of a subsequent threshold value comparison of the determined arc voltage.

Figure 3:
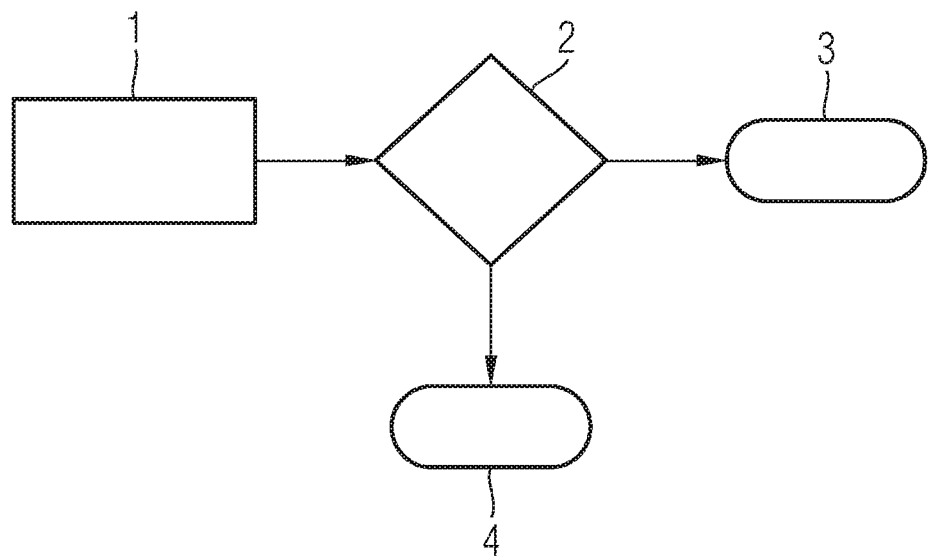
FIG. 3 shows a flow chart for arc fault detection

Such a diagram is illustrated in FIG. 3. In a first step 1, the continuous calculation of the arc voltage takes place.

In a second step 2, this or the amount thereof is in each case compared to the first threshold value SW1.

If the first threshold value SW1 is exceeded, the detection of an arc fault is displayed in a third step 3 and/or an arc fault detection signal is output.

If the first threshold value SW1 has not been exceeded, the message that no arc fault is present can be issued in a fourth step 4.

For example, the first threshold value SW1 can be 30 volts.

In general, the threshold value for a low-voltage mains can be in the range of between 20 and 300 volts, more precisely in the range between 20 and 150 volts, more specifically in the range of between 20 and 70 volts. In particular, values of between 25 and 50 volts appear to be suitable.

In the calculation of the arc voltage with the evaluation according to the invention, pronounced changes can occur at the ignition of an arc. For rapid and stable calculation of the arc voltage, it is therefore also possible for improvements to take place in such a way that, for example, the sign or signum function is modified.

In general, the signum function is calculated from the measured current as follows:

$$s(t)=\text{sign}(i_m(t))$$

Stable calculation results are frequently available only for the time after the arc ignition when the measurement voltage has completely covered the burning arc and is completely contained in the two or three integration intervals or value sets. In the transition region it is possible for unstable calculation results to occur. If the calculation results are filtered for this region, this results in a slight delay in the detection, but with more reliable determination results. Therefore, according to the invention a further embodiment can be used in which the signum function is set to the value zero if the determined voltage undershoots a second threshold value SW2 such as e.g. a voltage threshold value.

$$s(t)=0 | |u_m(t)| \leq U_{I\text{-}RLs}{}^s$$

The result of the signum function is e.g. always set to zero if the absolute value of the, for example simultaneous, voltage value of the value pair is less than or equal to the second threshold value SW2, as is $U_{I\text{-}RLs}{}^s$. In this respect, e.g. the anode-cathode voltage drop of approximately 20 V can be assumed to be a typical threshold value, since it can be presumed that an arc cannot occur below this value. The second threshold value SW2 or $U_{I\text{-}RLs}{}^s$ can assume any value of 5 to 150 volts, specifically in the range of 10 volts to 50 volts, in particular 15 to 20 volts.

Introducing this secondary condition for the calculation of the signum function minimizes instabilities in the calculation of the arc voltage which possibly occur during the arc ignition.

The sequence occurs in a way analogous to FIG. 3 to the effect that the determined voltage values are present in step 1. In step 2 a threshold value comparison is made with the second threshold value. When the threshold value is undershot, the signum function for the simultaneous or chronologically corresponding current value is set to the value zero. This value is then used for the further calculation. When the threshold value is exceeded the signum function is as is customary applied with respect to the current value.

In order to continue to avoid unacceptable calculation results, according to the invention, the arc voltage can advantageously be set to the value zero if the sum of the two or three integrals $s_s$ of the signum function or the sum of the two or three time sign value products $s_s$ yields the value zero.

$$U_{LB}=0\text{ V}|s_{s1}+s_{s2}=0$$

$$U_{LB}=0\text{ V}|s_{s1}+s_{s2}+s_{s3}=0$$

The arc fault detection according to an embodiment of the invention can be combined with further criteria, for example with a further comparison of the magnitude of the electrical current of the circuit. The measured current, in particular the effective value of the measured current, which can be calculated according to the method of Mann-Morrison, for example, is compared in this case to a third threshold value SW3 and an arc fault detection signal is output only if this third threshold value SW3 is exceeded and the calculated arc voltage exceeds the first threshold value SW1.

This criterion, identified as overcurrent release, leads to a reliable trouble locating. For the arc fault detection, a minimum arc fault current must flow in the circuit, in order to affect an arc fault detection signal. A value, which is a function of the operating current, can be chosen as threshold value for the overcurrent release. In the alternative, the threshold value determination could also take place in an arc-specific manner, because an arc current of typically 1000 A is necessary for a burning parallel low-voltage arc. In the case of serial arcs, considerably lower currents are present. That is to say, the third threshold value SW3 can assume every value, for example starting at 1 A, 10 A, 100 A, 1000 A or 5000 A, depending on use or application, respectively.

Figure 4:
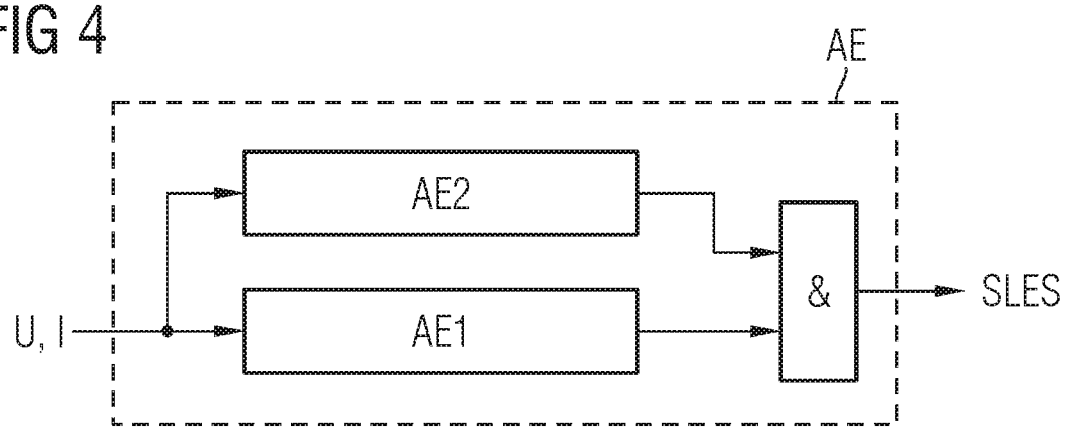
FIG. 4 shows a block circuit diagram of a solution according to an embodiment of the invention

The link between overcurrent release and the arc voltage calculation according to an embodiment of the invention is illustrated in FIG. 4.

FIG. 4 shows an illustration, in the case of which the determined voltage U and the determined current magnitude of the circuit is supplied to a first evaluation unit AE1 for determining the arc voltage according to an embodiment of the invention.

The determined current magnitude of the circuit is supplied to a second evaluation unit AE2, for checking the current criterion—exceeding of the third threshold value SW3.

The outputs of the two evaluation units AE1, AE2 are linked to an AND-unit &, the output of which outputs an arc fault detection signal SLES when the criteria are fulfilled.

The three evaluation units in this case can be arranged as partial units or subunits, respectively, in one evaluation unit AE.

The output of an arc fault detection signal can furthermore take place only if the arc voltage and/or the current criterion exceeds the corresponding threshold value at least twice. Analogously, exceeding the threshold value three times, four times, five times etc. can also lead to the outputting of an arc fault detection signal. A particularly reliable evaluation and detection of an arc fault is thus attained.

Figure 5:
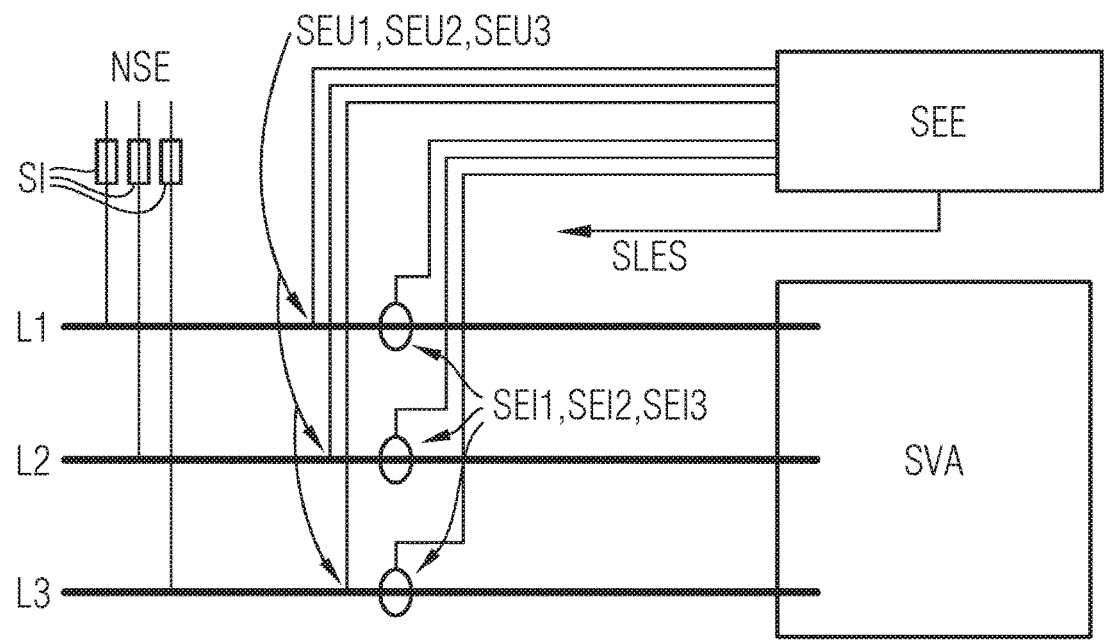
FIG. 5 shows a first illustration for explaining the use of an embodiment of the invention

FIG. 5 shows a schematic illustration of a schematic overview diagram for a system configuration with an output-selective arc fault detection unit for the detection of arc faults. FIG. 5 shows a low-voltage supply NSE, with fuses SI, which are followed by bars or bus bars L1, L2, L3, respectively, for the conductors of a three-phase alternating current system or circuit, respectively. The neutral conductor or zero conductor, respectively, is not illustrated. Each of the three bars L1, L2, L3 is in each case assigned a voltage sensor SEU1, SEU2, SEU3 and a current sensor SEI1, SEI2, SEI3. The bars are connected to a switching and/or distribution system SVA.

The voltage and current sensors are connected to an arc fault detection unit SEE according to the invention, which has an evaluation unit AE according to the invention. The latter has an output for outputting an arc fault detection signal SLES.

The voltage and current sensors determine voltage values and current magnitudes (current value and/or current value change) of the bus bars L1, L2, L3 and guide them to the arc fault detection unit SEE according to an embodiment of the invention.

The sensors are in this case arranged outside of the arc fault detection unit and are connected thereto.

Figure 6:
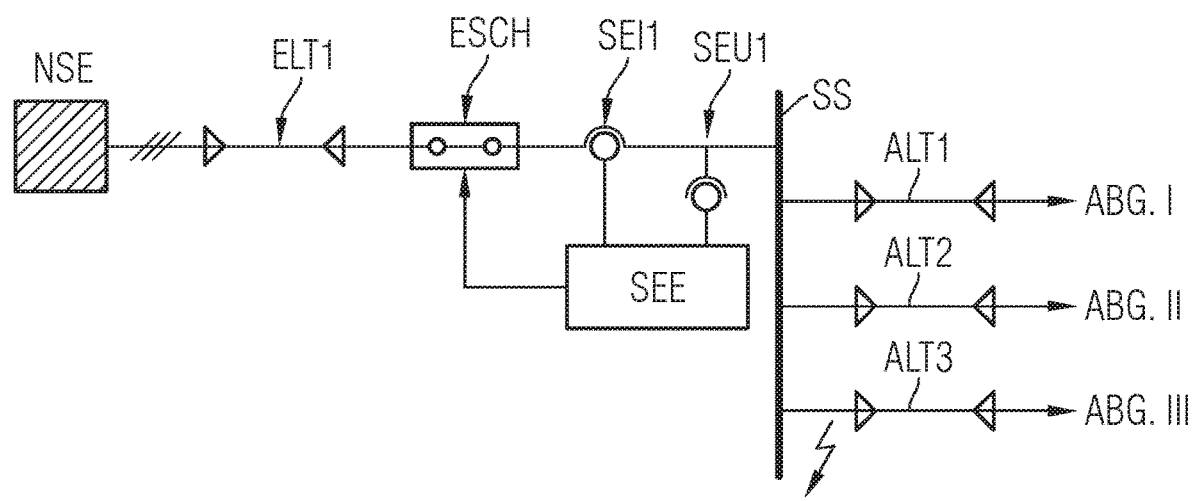
FIG. 6 shows a second illustration for explaining the use of an embodiment of the invention

FIG. 6 shows a further schematic illustration of a schematic overview diagram for a system configuration comprising a central arc fault detection unit for the detection of arc faults. FIG. 6 shows a low-voltage supply NSE, which is followed by a supply cable ELT1, which is followed by a supply switch ESCH, which is followed by a current sensor SEI1 and a voltage sensor SEU1, which is followed by a bus bar SS. 3 outputs ABG I ABG II and ABG III are provided on the bus bar SS. An output cable ALT1, ALT2, ALT3 is in each case assigned thereto.

The sensors SEI1, SEU1 are connected to an arc fault detection unit SEE, the output of which, in turn, is connected to the supply switch ESCH. The supply switch can in this case be a circuit breaker. When detecting an arc fault, the electrical circuit, i.e. the power supply of the bus bar SS, can be interrupted when an arc fault occurs for example in one of the outputs.

Figure 7:
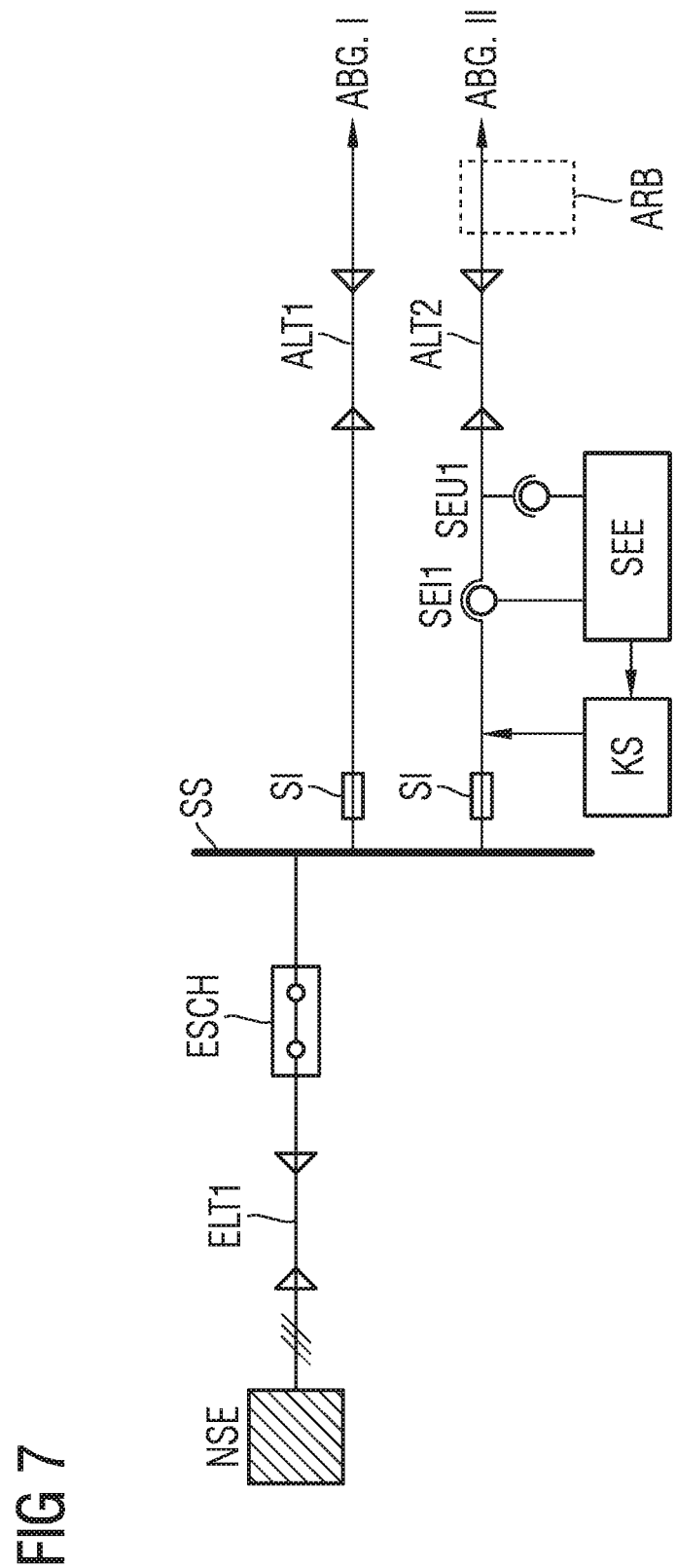
FIG. 7 shows a third illustration for explaining the use of an embodiment of the invention

FIG. 7 shows an illustration according to FIG. 6, with the difference that the sensors are arranged in the second output AGB II, which also has fuses SI and a short circuiter KS. The sensors SEI1 and SEU1 detect current and voltage values of the output ABG II and transfer them to the arc fault detection unit SEE. If the arc fault detection unit SEE detects an arc fault, an arc fault detection signal is output at its output and is transferred to the short circuiter KS. The latter then short-circuits the output ABG II, in order to extinguish the arc fault.

The arc fault detection according to FIG. 6 or 7 can for example be embodied as a mobile system.

An embodiment of the invention will be explained once again below.

High-energy arc faults, in particular parallel or high-energy arc faults can be detected, in particular in low-voltage switching and distribution systems, by way of an embodiment of the invention. According to an embodiment of the invention, in particular a numerical solution or detection algorithm, respectively, on the basis of the evaluation of measured voltage and current values or signals, respectively, is available for this purpose. For detecting arc faults, the voltage and the current or change of the current, respectively, is measured and an arc fault is determined by way of an arc voltage calculation according to an embodiment of the invention. Due to the quick arc detection, which is required in practice, a remarkably quick temporal evaluation can be provided in this way according to an embodiment of the invention.

High-energy arc faults, for example in switch and distribution systems, e.g. with a low-voltage, can be detected quickly by way of an embodiment of the invention, for example on the basis of a central voltage and current measurement on the supply.

An embodiment of the invention can in particular be used in an advantageous manner in, or in interaction with, circuit breakers or short circuiters.

An extensive installation of optical waveguides in systems for arc fault detection is not necessary. The voltage/current measurement can be realized in a central manner and can be used synergetically, if applicable, by further operating device(s).

An implementation in available switching and distribution systems is furthermore easily possible, because a detection system according to an embodiment of the invention can for example be installed only centrally and no installation into individual cells, which are to be protected, is necessary.

An embodiment of the invention can be realized as an assembly group comprising central voltage and current determination.

The detection systems, which are currently established on the market, are based on an optical error detection and thus have the potential for faulty tripping by the impact of extraneous light (e.g. flashlight). In the case of the solution according to the invention on the basis of a voltage and current measurement, this risk potential is not present.

Even though the invention has been illustrated and described in more detail by means of the example embodiment, the invention is not limited by the disclosed examples, and other alternatives can be derived therefrom by a person skilled in the art, without leaving the scope of protection of the invention.

The patent claims of the application are formulation proposals without prejudice for obtaining more extensive patent protection. The applicant reserves the right to claim even further combinations of features previously disclosed only in the description and/or drawings.

References back that are used in dependent claims indicate the further embodiment of the subject matter of the main claim by way of the features of the respective dependent claim; they should not be understood as dispensing with obtaining independent protection of the subject matter for the combinations of features in the referred-back dependent claims. Furthermore, with regard to interpreting the claims, where a feature is concretized in more specific detail in a subordinate claim, it should be assumed that such a restriction is not present in the respective preceding claims.

Since the subject matter of the dependent claims in relation to the prior art on the priority date may form separate and independent inventions, the applicant reserves the right to make them the subject matter of independent claims or divisional declarations. They may furthermore also contain independent inventions which have a configuration that is independent of the subject matters of the preceding dependent claims.

None of the elements recited in the claims are intended to be a means-plus-function element within the meaning of 35 U.S.C. § 112(f) unless an element is expressly recited using the phrase "means for" or, in the case of a method claim, using the phrases "operation for" or "step for."

Example embodiments being thus described, it will be obvious that the same may be varied in many ways. Such variations are not to be regarded as a departure from the spirit and scope of the present invention, and all such modifications as would be obvious to one skilled in the art are intended to be included within the scope of the following claims.

LIST OF REFERENCE NUMERALS

A amps
ABG I output I
ABG II output II
ABG III output III
ALT 1 output cable 1
ALT 2 output cable 2
ALT 3 output cable 3
ARB operating area
AE evaluation unit
AE1 first (partial) evaluation unit
AE2 second (partial) evaluation unit
ELT1 supply cable 1
ESCH supply switch, circuit breaker
I electrical current
$i_{Lb}$ arc current
$i_m$ current value, measured
$i'_m$ value of the change of the current value
KS short circuiter
$L_{BM}$ inductor, consumer
$L_{EK}$ inductor, supply cable
L1 bar, conductor 1

L2 bar, conductor 2
L3 bar, conductor 3
ms milliseconds
NSE low-voltage supply
$R_{BM}$ resistor, consumer
$R_{EK}$ resistor, supply cable
SEE arc fault detection unit
SEI1 current sensor
SEI2 current sensor
SEI3 current sensor
SEU1 voltage sensor
SEU2 voltage sensor
SEU3 voltage sensor
SLES arc fault detection signal
SI fuse
SS bus bar
SVA switching and distribution system
SW1 threshold value arc voltage
SW2 threshold value voltage
SW3 threshold value current release
SW4 threshold value arc voltage
t time
U electrical voltage
$U_{LB}$, $U_{1b}$ arc voltage
$u_m$ voltage value, measured
$u_n$ voltage value, power source/mains
V volts
& AND unit
1 step 1—continuous calculation arc voltage
2 step 2—threshold value comparison
3 step 3—output arc fault detection signal
4 step 4—no arc fault
100 power source
200 mains access/supply cable
300 consumer/operating means/energy sink
400 arc
500 monitored area
600 measuring points

What is claimed is:

1. An accidental arc detection unit for an electrical low-voltage circuit, comprising:
at least one voltage sensor assigned to the circuit, to periodically determine electrical voltage values of the electrical low-voltage circuit; and
at least one current sensor assigned to the electrical low-voltage circuit, to periodically determine electrical current magnitudes of the electrical low-voltage circuit, the at least one voltage sensor and the at least one current sensor being connected to an evaluation unit and being embodied such that
value pairs including a voltage value and a current magnitude, are continuously determinable,
a value set comprises a plurality of value pairs, and
an arc voltage, comparable to a first threshold value, is calculatable from two value sets and in response to the first threshold value being exceeded in magnitude, an accidental arc detection signal is output, the arc voltage being calculatable using an integral equation or a solution of the integral equation, wherein at least one of the following terms is calculatable from a value set:
a) a time voltage sum product, formed from time intervals and a sum of the voltage values, wherein the sum of the voltage values is formed by half the first voltage value, half the last voltage value and a sum of other voltage values of the value set;
b) a time current sum product, formed from time intervals and a sum of the current values, wherein the sum of the current values is formed by half the first current value, half the last current value and a sum of other current values of the value set;
c) a time current change value product, formed from time intervals and a sum of the values for the change in current over the time, wherein the sum of the values for the change in the current over the time is formed by half the first value, half the last value and a sum of other values of the value set; and
d) a time sign value product, formed from time intervals and a sum of the sign values of the current values, wherein a sign value assumes value of plus one for a positive current value and minus one for a negative current value and zero for a current value of zero, wherein the sum of the sign values is formed from half the sign value of the first current value, half the sign value of the last current value and a sum of sign values of other current values.

2. The accidental arc detection unit of claim 1, wherein the arc voltage, comparable to the first threshold value, is calculatable from three value sets and in response to the first threshold value being exceeded in magnitude, an accidental arc detection signal is output.

3. The accidental arc detection unit of claim 1, wherein at least one of an electrical current value and a value for a change of the electrical current value is determinable as electrical current magnitude.

4. The accidental arc detection unit of claim 1, wherein a value pair is assigned to just one value set.

5. The accidental arc detection unit of claim 1, wherein each value set has a fixed number of value pairs.

6. The accidental arc detection unit of claim 1, wherein at least one of the electrical voltage values and current magnitudes are determinable with a fixed time interval.

7. The accidental arc detection unit of claim 1, wherein a sign value of the current value assumes the value zero in response to the absolute value of the voltage value of this value pair undershooting a second threshold value.

8. The accidental arc detection unit of claim 1, wherein for two respective successive value sets, the following are respectively calculatable
a first time voltage sum product and a second time voltage sum product,
a first time current sum product and a second time current sum product,
a first time current change value product and a second time current change value product, and
a first time sign value product and a second time sign value product.

9. The accidental arc detection unit of claim 1, wherein for three respective successive value sets, the following are repsectively calculatable:
a first time voltage sum product, a second time voltage sum product and a third time voltage sum product,
a first time current sum product, a second time current sum product, and a third time current sum product,
a first time current change value product, a second time current change value product and a third time current change value product, and
a first time sign value product, a second time sign value product and a third time sign value product.

10. The accidental arc detection unit of claim 1, wherein the evaluation unit is embodied such that an accidental arc detection signal is output only in response to the current magnitude exceeding a third threshold value.

11. A circuit breaker, comprising:
the accidental arc detection unit of claim 1, connected to the circuit breaker and embodied such that the electrical circuit is interrupted by the circuit breaker in response to an accidental arc detection signal.

12. A short circuiter, comprising:
the accidental arc detection unit of claim 1, connected to the short circuiter and embodied such that the electrical circuit is short-circuited by the short circuiter in response to an accidental arc detection signal in order to effect an extinguishing of the accidental arc.

13. The accidental arc detection unit of claim 3, wherein in response to the electrical current value being determined, the change of the electrical current value is determinable from the electrical current value or wherein in response to the change of the electrical current value being determined, the electrical current value is determinable from the change of the electrical current value, so that the value pair has a voltage value, a current value and a value for a change of the electrical current value.

14. The accidental arc detection unit of claim 5, wherein the value pairs are continuously assignable to a value set until the fixed number of value pairs is reached and the following value pairs are assignable to the next value set.

15. The accidental arc detection unit of claim 8, wherein at least one of the following terms is formed for the calculation of the arc voltage:
a first product, formed from the third time voltage sum product and the second time current sum product,
a second product, formed from the second time voltage sum product and the third time current sum product,
a third product, formed from the second time current change value product and the first time current sum product,
a fourth product, formed from the first time current change value product and the second time current sum product,
a fifth product, formed from the second time voltage sum product and the first time current sum product,
a sixth product formed from the first time voltage sum product and the second time current sum product,
a seventh product, formed from the third time current change value product and the second time current sum product,
an eighth product, formed from the second time current change value product and the third time current sum product,
a ninth product, formed from the first time sign value product and the second time current sum product,
a tenth product, formed from the second time sign value product and the first time current sum product,
an eleventh product, formed from the second time sign value product and the third time current sum product, and
a twelfth product, formed from the third time sign value product and the second time current sum product.

16. The accidental arc detection unit of claim 8, wherein at least one of the following terms is formed for calculating the arc voltage:
a seventeenth product, formed from the first time current sum product and the number of value pairs of the second value set,
an eighteenth product, formed from the second time current sum product and the number of value pairs of the first value set,
a ninth difference, a minuend of which is the seventeenth product and a subtrahend of which is the eighteenth product, and
a tenth difference, a minuend of which is the tenth product and a subtrahend of which is the ninth product.

17. The accidental arc detection unit of claim 8, wherein at least one of the following terms is formed for the calculation of the arc voltage:
a ninth product, formed from the second time voltage sum product and the first time current change value product,
a twentieth product, formed from the first time voltage sum product and the second time current change value product,
a twenty first product, formed from the first time current change value product, and the number of value pairs of the second value set,
a twenty second product, formed from the second time current change value product and the number of value pairs of the first value set,
an eleventh difference, a minuend of which is the nineteenth product and a subtrahend of which is the twentieth product,
a twelfth difference, a minuend of which is the twenty the first product and a subtrahend of which is the twenty second product.

18. The accidental arc detection unit of claim 8, wherein at least one of the following terms is formed for the calculation of the arc voltage:
a twenty third product, formed from the first time current change value product and the second time sign value product,
a twenty fourth product, formed from the second time current change value product and the first time sign value product, and
a thirteenth difference, a minuend of which is the twenty third product and a subtrahend of which is the twenty fourth product.

19. The accidental arc detection unit of claim 8, wherein at least one of the following terms is formed for the calculation of the arc voltage:
a twenty fifth product, formed from the third time current change value product and the first time current sum product,
a twenty sixth product, formed from the first time current change value product and the third time current sum product,
a twenty seventh product, formed from the third time voltage sum product and the first time current sum product,
the twenty eight product, formed from the first time voltage sum product and the third time current sum production,
a twenty ninth product, formed from the third time current sum product and the number of value pairs of the first value set,
a thirtieth product, formed from the first time current sum product and the number of value pairs of the third value set,
a fourteenth difference, a minuend of which is the twenty fifth product and a subtrahend of which is the twenty sixth product,
a fifteenth difference, a minuend of which is the twenty seventh product and a subtrahend of which is the twenty eighth product,
a sixteenth difference, a minuend of which is the twenty ninth product and a subtrahend of which is the thirtieth product, and a seventeenth difference, a minuend of which is the eighteenth product and a subtrahend of which is the seventeenth production.

20. The accidental arc detection unit of claim 8, wherein at least one of the following terms is formed for the calculation of the arc voltage:
a thirty first product, formed from the third difference and the fourteenth difference,
a thirty second product, formed from the second difference and the fifteenth difference,
a thirty third product, formed from the second difference and the sixteenth difference,
a thirty fourth product, formed from the seventeenth difference and the fourteenth difference,
an eighteenth difference, a minuend of which is the thirty first product and a subtrahend of which is the thirty second product, and
a nineteenth difference, a minuend of which is the thirty third product and a subtrahend of which is the thirty fourth product.

21. The accidental arc detection unit of claim 8, wherein the arc voltage is set to the value zero in response to the sum of the first time sign value product and the second time sign value product or the sum of the first time sign value product, the second time sign value product and the third time sign value product is equal to zero.

22. The accidental arc detection unit of claim 15, wherein at least one of the following terms is formed for the calculation of the arc voltage:
a first difference, a minuend of which is the first product and a subtrahend of which is the second product,
a second difference, a minuend of which is the third product and a subtrahend of which is the fourth product,
a third difference, a minuend of which is the fifth product and a subtrahend of which is the sixth product,
a fourth difference, a minuend of which is the seventh product and a subtrahend of which is the eight product,
a fifth difference, a minuend of which is the ninth product and a subtrahend of which is the tenth product, and
a sixth difference, a minuend of which is the eleventh product and a subtrahend of which is the twelfth product.

23. The accidental arc detection unit of claim 16, wherein the arc voltage is a quotient, a dividend of the quotient including terms of the third difference and a divisor of the quotient including terms of the ninth difference.

24. The accidental arc detection unit of claim 16, wherein the arc voltage is a quotient, a dividend of the quotient including terms of the third difference and a divisor of the quotient including terms of the tenth difference.

25. The accidental arc detection unit of claim 17, wherein the arc voltage is a quotient, a dividend of the quotient including terms of the eleventh difference and a divisor of the quotient including terms of the twelfth difference.

26. The accidental arc detection unit of claim 18, wherein the arc voltage is a quotient, a dividend of the quotient including terms of the eleventh difference and a divisor of the quotient including terms of the thirteenth difference.

27. An accidental arc detection unit of claim 20, wherein the arc voltage is a quotient, a dividend of the quotient including terms of the eighteenth difference and a divisor of the quotient including terms of the nineteenth difference.

28. The accidental arc detection unit of claim 22, wherein at least one of the following terms is formed for the calculation of the arc voltage:

a thirteenth product, formed from the first difference and the second difference,
a fourteenth product, formed from the third difference and the fourth difference,
a fifteenth product, formed from the fifth difference and the fourth difference, and
a sixteenth product, formed from the sixth difference and the second difference.

29. The accidental arc detection unit of claim 28, wherein hat at least one of the following terms is formed for the calculation of the arc voltage:
a seventh difference, a minuend of which is the thirteenth product and a subtrahend of which is the fourteenth product,
an eighth difference, a minuend of which is the fifteenth product and a subtrahend of which is the sixteenth product.

30. The accidental arc detection unit of claim 29, wherein the arc voltage is a quotient, the dividend of which includes terms of the seventh difference and the divisor of which includes terms of the eighth difference.

31. A method for accidental arc detection for an electrical low-voltage circuit, wherein electrical voltage values and current magnitudes of the circuit are determined periodically, so that value pairs having a voltage value and a current magnitude are continuously present, wherein a value set comprises a plurality of value pairs, at least one voltage sensor being assigned to the electrical low-voltage circuit, to periodically determine electrical voltage values of the electrical low-voltage circuit; and at least one current sensor being assigned to the electrical low-voltage circuit, to periodically determine electrical current magnitudes of the electrical low-voltage circuit, the at least one voltage sensor and the at least one current sensor being connected to an evaluation unit and being embodied such that value pairs including a voltage value and a current magnitude, are continuously determinable, the method comprising:
calculating an arc voltage, compared to a first threshold value, from two value sets; and
outputting, in response to a first threshold value being exceeded in magnitude, an accidental arc detection signal, the arc voltage being calculated using an integral equation or a solution of the integral equation, wherein at least one of the following terms is calculatable from a value set:
a) a time voltage sum product, formed from time intervals and a sum of the voltage values, wherein the sum of the voltage values is formed by half the first voltage value, half the last voltage value and a sum of other voltage values of the value set;
b) a time current sum product, formed from time intervals and a sum of the current values, wherein the sum of the current values is formed by half the first current value, half the last current value and a sum of other current values of the value set;
c) a time current change value product, formed from time intervals and a sum of the values for the change in current over the time, wherein the sum of the values for the change in the current over the time is formed by half the first value, half the last value and a sum of other values of the value set; and
d) a time sign value product, formed from time intervals and a sum of the sign values of the current values, wherein a sign value assumes value of plus one for a positive current value and minus one for a negative current value and zero for a current value of zero, wherein the sum of the sign values is formed from half the sign value of the first current value, half the sign value of the last current value and a sum of sign values of other current values.

32. The method of claim 31, wherein at least one of an electrical current value and a value for a change of the electrical current value is determinable as electrical current magnitude.

33. The method of claim 32, wherein in response to the electrical current value being determined, the change of the electrical current value is determinable from the electrical current value or wherein in response to the change of the electrical current value being determined, the electrical current value is determinable from the change of the electrical current value, so that the value pair has a voltage value, a current value and a value for a change of the electrical current value.

* * * * *